(12) United States Patent
Brosh et al.

(10) Patent No.: US 11,104,457 B1
(45) Date of Patent: Aug. 31, 2021

(54) POWER DISTRIBUTION DEVICE

(71) Applicant: BAE Systems Information and Electronic Systems Integration Inc., Nashua, NH (US)

(72) Inventors: Richard M. Brosh, Manassas, VA (US); Jonathan W. Edwards, Brookeville, MD (US); Eric H. Liu, McLean, VA (US); Todd W. Montgomery, Arlington, VA (US); Christopher T. Scioscia, Centreville, VA (US); Daniel L. Stanley, Warrenton, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 17/116,246

(22) Filed: Dec. 9, 2020

(51) Int. Cl.
| | |
|---|---|
| *H03K 17/08* | (2006.01) |
| *B64G 1/42* | (2006.01) |
| *H03K 17/687* | (2006.01) |
| *H03K 19/003* | (2006.01) |
| *G05F 1/46* | (2006.01) |
| *G01R 1/20* | (2006.01) |
| *G01R 19/165* | (2006.01) |

(52) U.S. Cl.
CPC .............. *B64G 1/428* (2013.01); *G01R 1/203* (2013.01); *G01R 19/16538* (2013.01); *G05F 1/46* (2013.01); *H03K 17/08* (2013.01); *H03K 17/687* (2013.01); *H03K 19/0033* (2013.01)

(58) Field of Classification Search
CPC .. B64G 1/428; G01R 19/16538; H03K 17/08; H03K 19/0033
USPC ........................................ 307/113, 115, 126
See application file for complete search history.

(56) References Cited

U.S. PATENT DOCUMENTS

| | | | |
|---|---|---|---|
| 6,617,831 | B2 | 9/2003 | Perol |
| 6,996,389 | B2 | 2/2006 | Fitzpatrick et al. |
| 7,484,032 | B2 | 1/2009 | Smith |
| 9,751,642 | B2 | 9/2017 | Eickhoff |
| 2010/0109440 | A1 | 5/2010 | Santrach et al. |
| 2018/0052432 | A1* | 2/2018 | Kim .................. G06F 1/263 |

FOREIGN PATENT DOCUMENTS

| | | |
|---|---|---|
| CN | 100505457 | 6/2009 |
| EP | 2502248 | 9/2012 |

* cited by examiner

*Primary Examiner* — William Hernandez
(74) *Attorney, Agent, or Firm* — Finch & Maloney PLLC; Scott J. Asmus

(57) ABSTRACT

A power distribution device includes an input, an output, a power switch controller, and a voltage isolation device. The power distribution device includes, and is designed to provide power to, for example, non-radiation-tolerant or non-radiation hardened components for use in low Earth orbit (LEO) missions. The input is configured to receive power from a power source. The output is configured to provide the power to an electrical load. The power switch controller is configured to selectively operate the power distribution device in a first mode responsive to a first event, and to selectively operate the power distribution device in a second mode responsive to a second event. The voltage isolation device includes a plurality of switches configured, in the first mode, to pass the power between the input and the output, and, in the second mode, to interrupt the passage of the power between the input and the output.

20 Claims, 7 Drawing Sheets

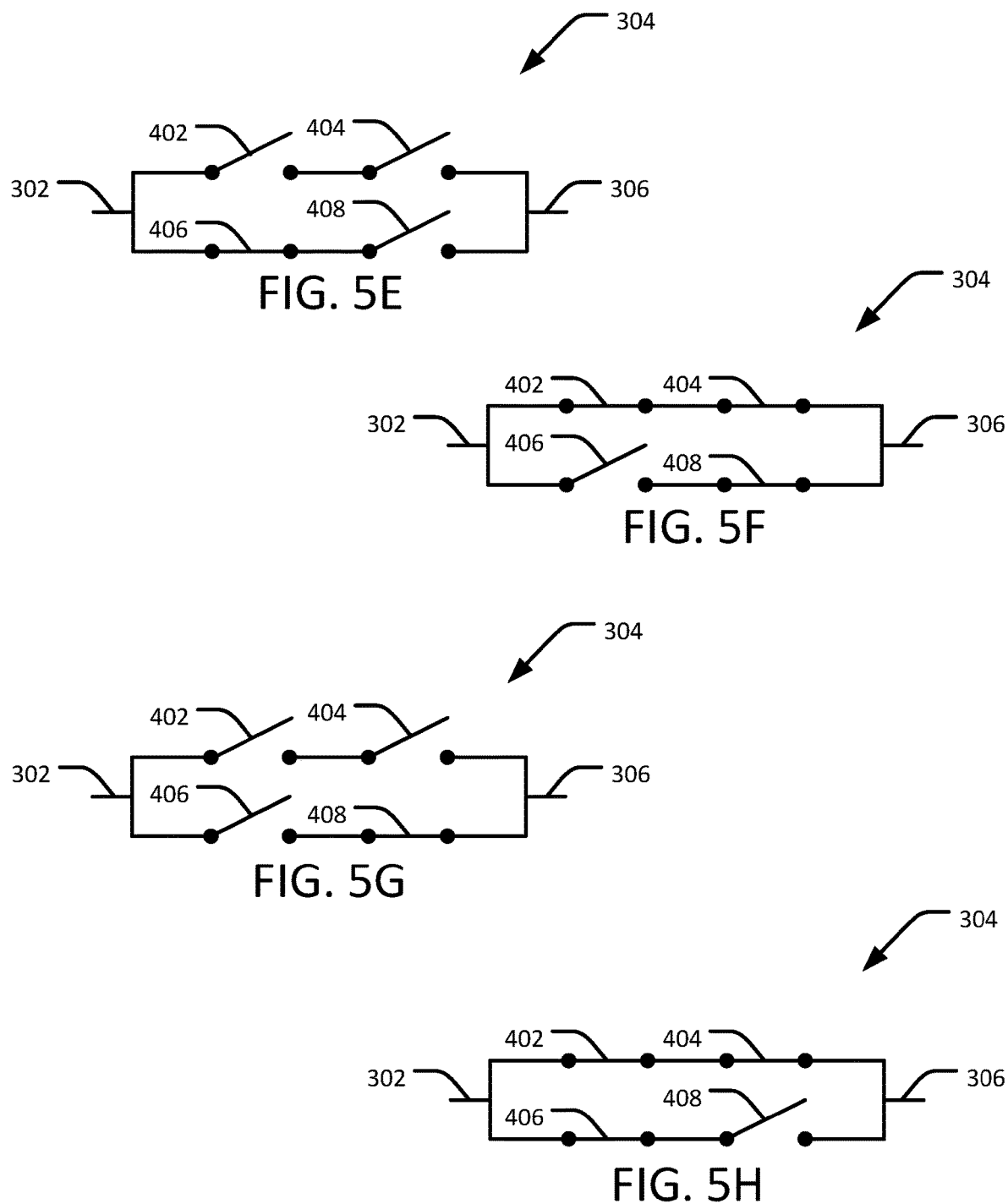

POWER DISTRIBUTION DEVICE

STATEMENT OF GOVERNMENT INTEREST

This invention was made with United States government support under prime contract no. FA8620-19-C-4039 awarded by the U.S. Air Force. The United States government has certain rights in the invention.

FIELD OF THE DISCLOSURE

This disclosure relates generally to power distribution devices.

BACKGROUND

Radiation is a form of energy that is emitted in the form of rays, electromagnetic waves, and/or particles. Radiation can be created by humans (for example, by microwaves, cell phones, radios, light bulbs, diagnostic medical applications such as x-rays) or it can occur naturally (for example, from the Sun, radioactive elements in the Earth's crust, radiation trapped in the Earth's magnetic field, stars, and other astrophysical objects like quasars or galactic centers). Earth's biggest source of radiation is the Sun. The Sun emits all wavelengths in the electromagnetic spectrum (EM). The majority is in the form of visible, infrared, and ultraviolet radiation (UV). Occasionally, giant explosions, called solar flares, occur on the surface of the Sun and release massive amounts of energy out into space in the form of x-rays, gamma rays, and streams of protons and electrons. This is called a solar particle event (SPE). These solar flares, and other sources of radiation, can damage sensitive electronic equipment that is not hardened to the effects of radiation. Radiation hardening is a process of making electronic components and circuits resistant to damage or malfunction caused by high levels of ionizing radiation (particle radiation and high-energy electromagnetic radiation), especially for environments in outer space (including low Earth orbit), around nuclear reactors and particle accelerators, or during nuclear accidents or nuclear warfare. Electronic components and circuits that are resistant to ionizing radiation are said to be radiation-hardened or radiation-tolerant. However, radiation-hardened electronics cost significantly more than non-radiation hardened equivalents and are often more difficult to procure, especially when the latest and most capable state-of-the-art components are desired. Therefore, non-trivial issues remain with respect to designing devices that are cost-effective yet capable of operating reliably in high radiation environments.

BRIEF DESCRIPTION OF THE DRAWINGS

FIG. 5E is a schematic diagram of an example switching circuit in the open state where a third switch has failed to open when commanded to open, in accordance with an embodiment of the present disclosure.

FIG. 5F is a schematic diagram of an example switching circuit in the closed state where the third switch has failed to close when commanded to close, in accordance with an embodiment of the present disclosure.

FIG. 5G is a schematic diagram of an example switching circuit in the open state where a fourth switch has failed to open when commanded to open, in accordance with an embodiment of the present disclosure.

FIG. 5H is a schematic diagram of an example switching circuit in the closed state where the fourth switch has failed to close when commanded to close, in accordance with an embodiment of the present disclosure.

DETAILED DESCRIPTION

Figure 1:
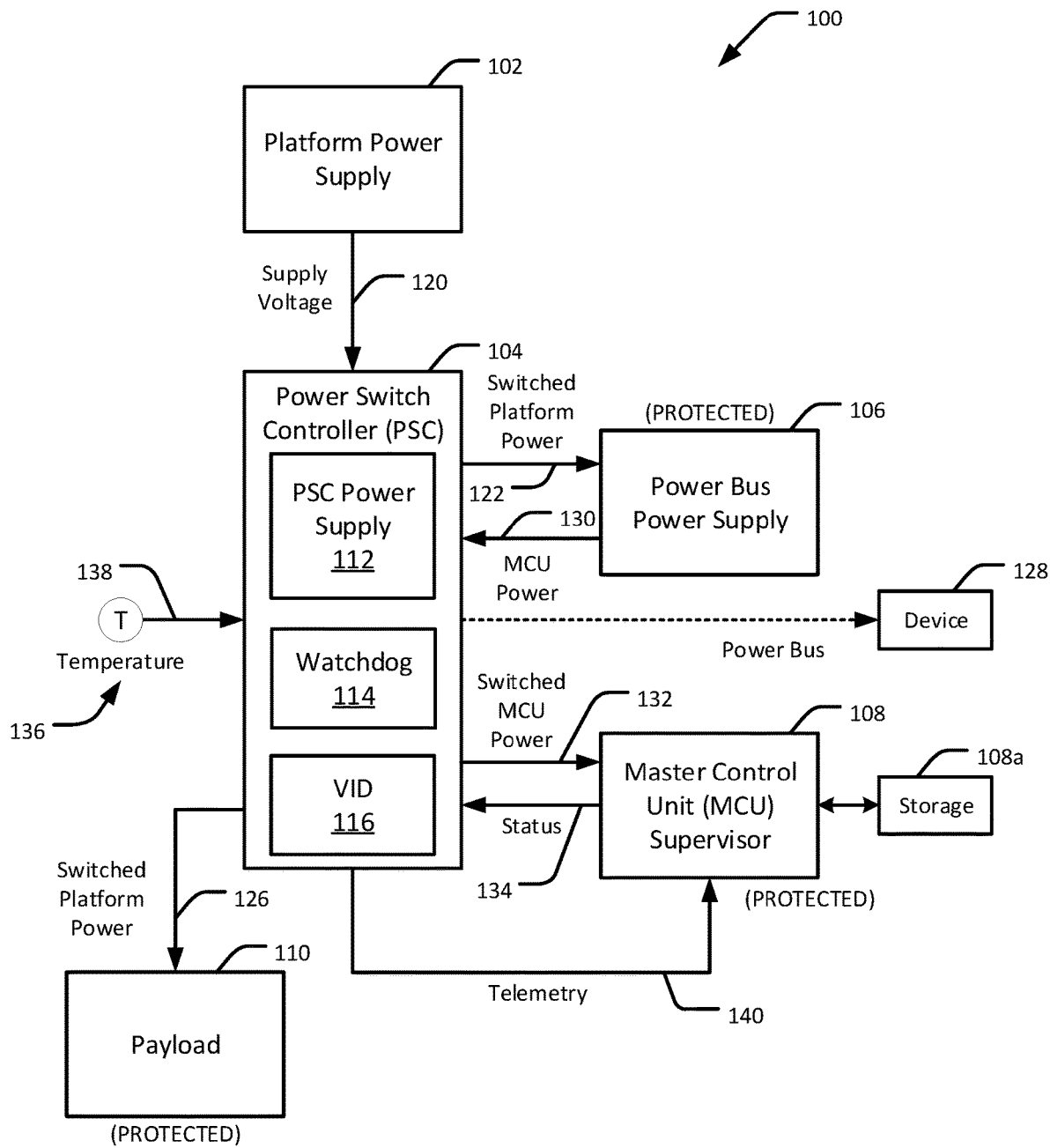
FIG. 1 is a block diagram of an example power distribution system, in accordance with an embodiment of the present disclosure.

Power distribution devices are disclosed. In one example case, the power distribution device includes an input, an output, a power switch controller, and a voltage isolation device. The power distribution device includes, and is designed to provide power to, for example, non-radiation-tolerant or non-radiation hardened electronics for use in low Earth orbit (LEO) missions, although other applications may benefit as well. The input is configured to receive power from a power source. The output is configured to provide the power to an electrical load. The power switch controller is configured to selectively operate the power distribution device in a first mode responsive to a first event, and to selectively operate the power distribution device in a second mode responsive to a second event. The voltage isolation device includes a plurality of switches configured, in the first mode, to pass the power between the input and the output, and, in the second mode, to interrupt the passage of the power between the input and the output. The switches include first, second, third, and fourth switches between the input and the output. The first and second switches are in series with each other, the third and fourth switches are in series with each other, and the first and second switches are in parallel with the third and fourth switches. The switches are configured such that, in the first mode, the power is passed between the input and the output even when one of the switches is open (failed to close), and such that, in the second mode, the passage of the power is interrupted between the input and the output even when one of the switches is closed (failed to open). The first event and the second event are each based on detection of, or absence of, an overvoltage condition, an overcurrent condition, or other detectable condition that causes the switches to be commanded open or closed to protect any non-radiation-tolerant or non-radiation-hardened devices or components connected to the output from potential damage, for example, when operating during LEO missions.

General Overview

As noted above, electronic components and circuits, particularly those used in space, are susceptible to damage caused by ionizing radiation. For example, satellite applications for LEO missions require high performance, high reliability, and cost competitive electronics. Conventional electronics used for satellite applications typically utilize mature technology with qualified, radiation-hardened components. However, the qualified, radiation-hardened components are less capable than state of the art components, have limited availability, and are typically significantly more expensive than non-radiation-hardened equivalents. For certain short-term missions, such as two-year LEO constellation missions, there is a need for the capability to use state-of-the-art, non-radiation-hardened electronics to reduce costs as well as to improve performance of such missions. However, such commercial electronics, when used in place of radiation-hardened components, are susceptible to radiation damage and therefore such use increases the risk of mission failure.

To this end, a power distribution architecture is provided herein that is suitable for using and/or providing power to non-radiation hardened electronics. In an embodiment, the power distribution device includes one or more voltage isolation devices and a microcontroller supervisor, which operates independently of the voltage isolation device(s). The voltage isolation devices provide real-time, autonomous control of switched power to one or more electrical loads, and provides telemetry to the microcontroller supervisor, which provides a situational watchdog function for further protecting the electronics from radiation-induced damage. In some embodiments, the microcontroller supervisor is radiation-tolerant or radiation-hardened. The microcontroller situational watchdog function reacts to the voltage isolation device telemetry and to telemetry from pertinent system functions. The power distribution device is designed to protect non-radiation-hardened electrical components from damage in a LEO mission environment, but may be beneficially used in any number of environments, as will be appreciated. The power distribution device can circumvent outages caused by an overvoltage condition, a voltage dropout (undervoltage) condition, an overcurrent condition, and an over-temperature condition. Circumvention techniques implemented by the power distribution device include, for example, disabling, interrupting, or otherwise disconnecting power from non-radiation hardened devices, providing system power during a reset sequence, providing power up/down sequencing of system components, and providing power down functions to improve radiation survivability reliability. Numerous configurations will be appreciated in light of this disclosure.

Example Power Distribution System

FIG. 1 is a block diagram of an example power distribution system 100, in accordance with an embodiment of the present disclosure. The system 100 includes a platform power supply 102, a power switch controller 104, a protected power bus power supply 106, a protected master control unit (MCU) microcontroller supervisor 108, and one or more protected payloads 110 (also referred to as electrical loads). In some embodiments, the MCU supervisor 108 can include storage 108a (external, internal, or both) for storing execution instructions or other data. In some embodiments, the MCU microcontroller supervisor 108 includes radiation-tolerant or radiation-hardened components, while at least some other components of the system 100, such as the platform power supply 102, the power switch controller 104, the protected power bus power supply 106, and/or one or more of the payloads 110 can include non-radiation-tolerant or non-radiation-hardened components. The term protected, in addition to its plain and ordinary meaning, refers to a device, component, or other electrical load that is protected from damage or malfunction by selective removal of a supply of power to the device, component, or other electrical load such that the device, component, or other electrical load does not receive power from an external source under certain conditions when a potential for such damage or malfunction exists. For example, a protected device is a device that is protected from experiencing an overvoltage or an overcurrent condition that could damage the device, a device that is protected from thermally induced damage by removal of power when the device is operating under an over-temperature condition, or a device that is protected from radiation-induced damage by removal of power during a high-radiation event.

The platform power supply 102 can include, for example, a 28-volt power supply designed to provide power for use by at least a part of the system 100, including the power switch controller 104, the power bus power supply 106, the MCU supervisor 108, and the one or more payloads 110. The power control switch 104 includes a power control switch power supply 112, a watchdog processor 114, and one or more voltage isolation devices (VID) 116.

The platform power supply 102 generates a supply voltage 120, which is provided to the power switch controller 104. The voltage 120 can be, for example, 28 volts direct current (DC) or any other suitable voltage, as will be appreciated. The platform power supply 102 acts as the primary source of power for the system 100, including the one or more payloads 110, although it will be understood that in some applications additional separate power supplies can be used to provide power to at least parts of the system.

The power switch controller 104, in turn, provides switched platform power 122 to the power bus power supply 106, switched MCU power 124 to the MCU supervisor 108, and switched platform power 126 to the one or more payloads 110 when operating in one of two modes—switched power on (switches commanded closed) and switched power off (switches commanded open). The switched power, in addition to its plain and ordinary meaning, refers to a source of power that can be selectively and controllably applied to and removed from a device, component, or other electrical load. In some embodiments, the power switch controller 104 operates autonomously in response to the presence of certain detected conditions of the system 100, such as overvoltage, undervoltage, overcurrent, over-temperature, and under-temperature to rapidly provide or remove switched power.

In some embodiments, the power switch controller 104 operates in conjunction with the watchdog 114 in response to the presence of certain detected conditions of the system 100, such as: to provide a soft overcurrent disconnect when operating in certain power modes; to provide on/off control when the system 100 is crossing a known high radiation band or otherwise in the presence of a high radiation condition at the electrical load; to provide on/off control if an over-temperature event is detected; and/or to provide on/off control based on an increased current and/or voltage due to a component parameter variation drift (load performance), which can require a temporary shutdown until the parameter comes back in range. For example, the power switch controller 104 can be configured to detect an unexpected event, such as an unexpected power draw, for a particular application and respond by providing inrush current limiting and/or overcurrent protection to the system 100 when such an unexpected event occurs. In some examples, the watchdog 114 detects these conditions based at least in part on a status signal 134 generated by the MCU supervisor 108. The power switch controller power supply 112 provides supply voltage power 120 to the watchdog 114 via at least one of the voltage isolation devices 116, as will be described in further detail with respect to FIGS. 2, 3, 4A-B, and 5A-G. The power bus power supply 106 and the power switch controller power supply 112 are each isolated from the platform power supply 102 by at least one switch or relay, such as in the voltage isolation device 116.

Figure 2:
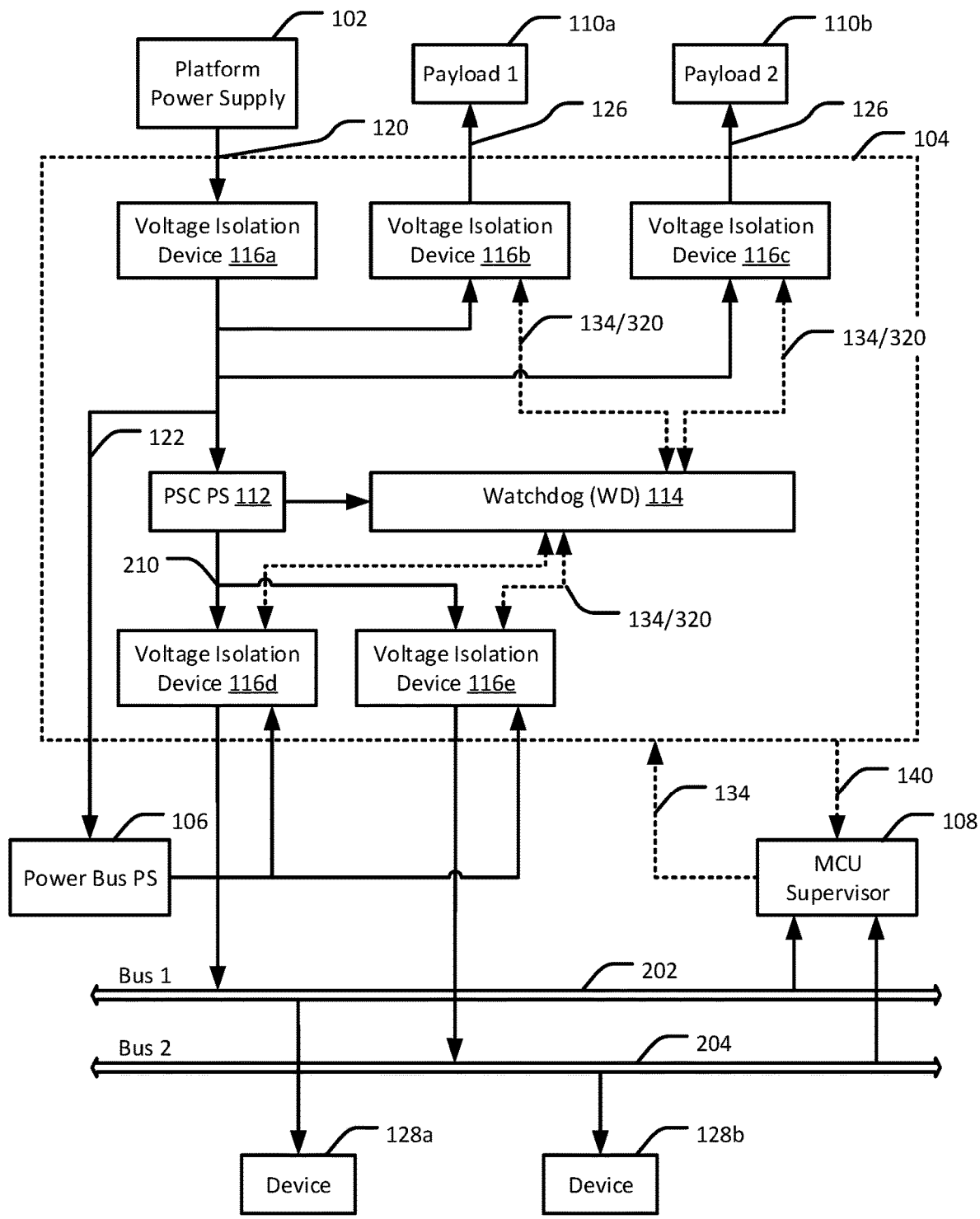
FIG. 2 is a block diagram of a portion of the example system of FIG. 1, in accordance with an embodiment of the present disclosure.

The power bus power supply 106 provides the switched platform power 122 to one or more busses 202, 204, such as shown in FIG. 2, for supplying power to one or more devices 128 (electrical loads) off of the busses. The power bus power supply 106 further provides MCU power 130 to the power switch controller 104, which in turn provides switched MCU power 132 to the MCU supervisor 108 via at least one of the voltage isolation devices 116, as will be described in further detail with respect to FIG. 2.

In some embodiments, a temperature sensor 136 provides a temperature signal 138 to the power switch controller 104 for use by the one or more voltage isolation devices 116, as will be described in further detail with respect to FIG. 3. For example, the temperature sensor 136 can be configured to detect a temperature of any portion of the system 100, including the one or more payloads 110 and the one or more devices 128 or other electrical loads, and to convert the detected temperature into the temperature signal 138. Each voltage isolation device 116 receives the temperature signal 138, which can be used to switch the switched platform power 122, the switched MCU power 132, and/or the switched platform power 126 off during the presence of an over-temperature or under-temperature condition. For example, when the temperature signal 138 indicates that any portion of the system 100 is operating above or below a setpoint temperature (for instance, too hot or too cold), the power switch controller 104 switches off the power to the power bus power supply 106, the MCU supervisor 108, and/or the one or more payloads 110. In another example, when the temperature signal 138 indicates that any portion of the system 100 is operating within a setpoint temperature range (for instance, in the absence of an over- or under-temperature condition), the power switch controller 104 switches on the power to the power bus power supply 106, the MCU supervisor 108, and/or the one or more payloads 110.

In some examples, the MCU supervisor 108 receives telemetry 140 from the power switch controller 104. The telemetry 140 can include, for example, operational data from the switch controller 104 that is used to generate the status signal 134 provided to the watchdog 114. The telemetry 140 can represent, for example, the state of the voltage interruption device(s) 116, such as whether they are permitting power to pass through or interrupting power from passing through, and whether the constituent components of the voltage interruption device(s) 116 are operating normally or experiencing a detected failure condition. For example, if the telemetry 140 indicates a detected failure condition of the voltage interruption device(s) 116, the MCU supervisor 108 can change the status 134 to cause the power switch controller 104 to take an action, such as switching off the switched platform power 122 and/or 126, and/or the switched MCU power 132 as a preventative measure until the failure condition is resolved or corrected.

FIG. 2 is a block diagram of a portion of the example system 100 of FIG. 1, in accordance with an embodiment of the present disclosure. In FIG. 2, solid connector lines represent power flows and dashed connector lines represent signal flows. FIG. 2 shows additional details of the power switch controller 104. In this example, the platform power supply 102 feeds the supply voltage 120 to a first voltage isolation device 116a, which in turn supplies power to one or more second voltage isolation devices 116b, 116c, the power switching circuit power supply 112, and the power bus power supply 106. The one or more second voltage isolation devices 116b, 116c each provide switched platform power 126 to one or more payloads 110a, 110b. The power switching circuit power supply 112 supplies power to the watchdog 114 and one or more third voltage isolation devices 116d, 116e, which in turn provide power to one or more busses 202, 204. The busses 202, 204 can be used to supply power to one or more devices 128a, 128b and to the MCU supervisor 108 (also referred to as electrical loads).

Figure 3:
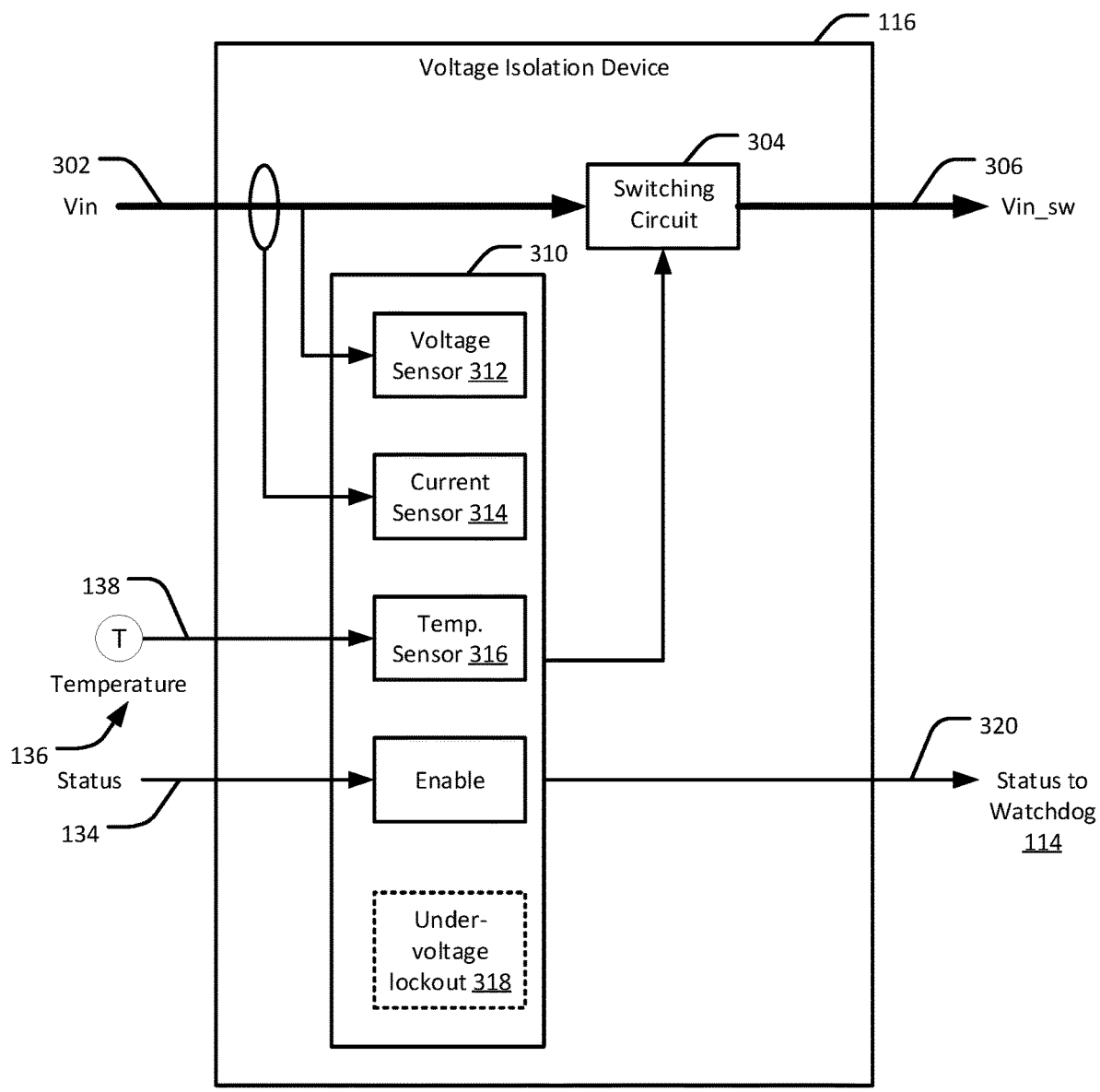
FIG. 3 is a block diagram of an example voltage isolation device, in accordance with an embodiment of the present disclosure.

In some embodiments, the voltage isolation device 116 of FIGS. 1 and 3 is powered by the platform power supply 102. For example, as shown in FIG. 2, the voltage isolation device 116a is powered from the platform power supply 102, and the voltage isolation devices 116b and 116c receive switched platform power 126 via the voltage isolation device 116a. In some embodiments, the voltage isolation device 116 of FIGS. 1 and 3 is powered by the power switch controller power supply 112. For example, as shown in FIG. 2, the voltage isolation devices 116d and 116e each receive switched platform power 210 from the power switch controller power supply 112. An example of the voltage isolation devices 116, 116a, 116b, 116c is described in further detail with respect to FIGS. 3, 4A-B, and 5A-H.

FIG. 3 is a block diagram of an example voltage isolation device 116, in accordance with an embodiment of the present disclosure. The voltage isolation device 116 includes an input terminal 302, a switching circuit 304, and an output terminal 306. The switching circuit 304 selectively controls the passage or interruption of voltage and current between the input terminal 302 and the output terminal 306. The switching circuit 304 is controlled by a processor 310, which includes a voltage sensor 312, a current sensor 314, a temperature sensor 316, and, in some embodiments, an undervoltage lockout 318.

The voltage sensor 312 monitors a voltage level at the input terminal 302. The voltage isolation device 116 causes the switching circuit 304 to selectively enter a closed (power on) state when the voltage level is within a predefined operational range or otherwise in the absence of an overvoltage or an undervoltage condition. When the switching circuit 304 is in the closed state, the input terminal 302 is in electrical communication with the output terminal 306, allowing voltage and current to pass from the input terminal 302 to the output terminal 306. The voltage isolation device 116 causes the switching circuit 304 to selectively enter an open (power off) state when the voltage level is outside of the predefined operational range, for example, when the presence of an overvoltage or an undervoltage condition is detected by the voltage sensor 312. When the switching circuit 304 is in the open state, the input terminal 302 is isolated from the output terminal 306, which interrupts voltage and current between the input terminal 302 and the output terminal 306.

In embodiments that include the undervoltage lockout 318, the voltage isolation device causes the switching circuit to selectively enter the open state when the voltage at the input terminal 302 drops below an operational value. After the voltage at the input terminal returns to an operational range, the voltage isolation device can reset or restart the electrical load, depending on the switching circuit configuration (for example, whether the switching circuit is latched off or momentarily turned off during an undervoltage condition).

The current sensor 314 monitors a current level at the input terminal 302. The voltage isolation device 116 causes the switching circuit 304 to selectively enter a closed state when the current level is within a predefined operational range or otherwise in the absence of an overcurrent or an undercurrent condition. The voltage isolation device 116 causes the switching circuit 304 to selectively enter an open state when the current level is outside of the predefined operational range, for example, when the presence of an overcurrent or an undercurrent condition is detected by the current sensor 314.

The temperature sensor 316 monitors the temperature signal 138 from the temperature sensor 136. The voltage isolation device 116 causes the switching circuit 304 to selectively enter a closed state when the temperature signal is within a predefined operational range or otherwise in the absence of an over-temperature or an under-temperature condition. The voltage isolation device 116 causes the switching circuit 304 to selectively enter an open state when the temperature signal is outside of the predefined operational range, for example, when the presence of an over-temperature or an under-temperature condition is detected by the temperature sensor 136.

In some embodiments, the voltage isolation device 116 is configured to receive the status signal 134 generated by the MCU supervisor 108 or the watchdog 114. The status signal 134 is used to enable or disable the switching circuit 304. For example, if the status signal 134 is a logical high (on), or some other signaling scheme (such as an oscillating signal), then the switching circuit is selectively enabled (allowed) to enter the closed state (on) by closing the switches as long as other conditions are met (e.g., voltage, current, or temperature, as discussed above). Otherwise, the switching circuit is selectively disabled and placed in the open state (off) by opening the switches regardless of the other conditions.

The voltage isolation device 116 can be configured to provide a status signal 320 to the watchdog 114. For example, if the voltage isolation device 116 is operating normally (the switching circuit 304 is closed), the status signal 320 can be set to a logical high (on) or some other signaling scheme (such as an oscillating signal). Otherwise, the status signal 320 can be set to a logical low (off).

Figure 4A:
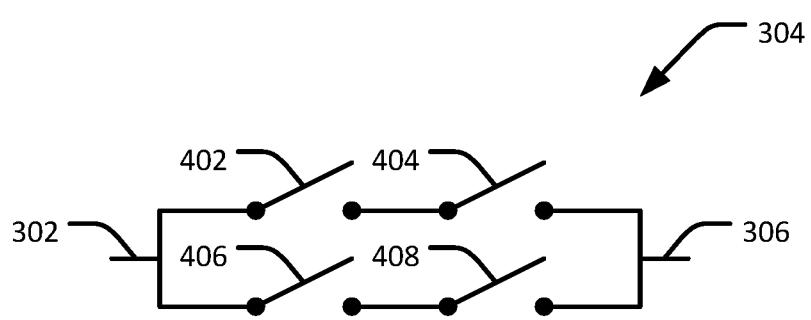
FIG. 4A is a schematic diagram of an example switching circuit in an open state, in accordance with an embodiment of the present disclosure.

FIG. 4A is a schematic diagram of the switching circuit 304 of FIG. 3 in an open state (on mode), in accordance with an embodiment of the present disclosure. The switching circuit 304 includes four switches: a first switch 402, a second switch 404, a third switch 406, and a fourth switch 408. The first and second switches 402 and 404 are in series with each other and with the input terminal 302 and the output terminal 306. The third and fourth switches 406 and 408 are in series with each other and with the input terminal 302 and the output terminal 306. The first and second switches 402 and 404 are in parallel with the third and fourth switches 406 and 408. In the open state, all four switches 402, 404, 406, and 408 are open, as shown, thereby interrupting the flow of current between the input terminal 304 and the output terminal 306.

Figure 4B:
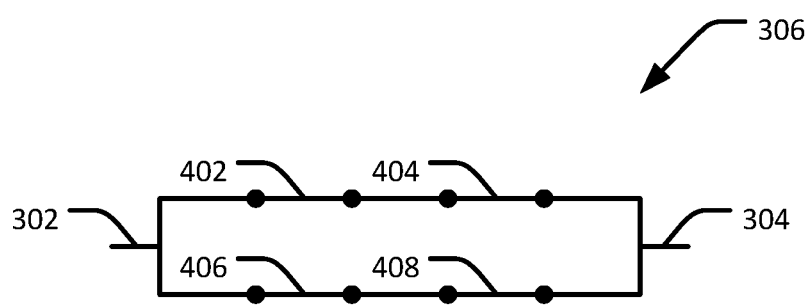
FIG. 4B is a schematic diagram of an example switching circuit in a closed state, in accordance with an embodiment of the present disclosure.

FIG. 4B is a schematic diagram of the switching circuit 304 of FIG. 3 in a closed state (off mode), in accordance with an embodiment of the present disclosure. In the closed state, all four switches 402, 404, 406, and 408 are closed, as shown, thereby connecting the input terminal 304 to the output terminal 306 via two parallel paths through the switches 402 and 404, and the switches 406 and 408, respectively.

The switch configurations for the open and closed states of the switching circuit 304 shown in FIGS. 4A and 4B, respectively, represent the normal operating conditions for the voltage isolation device 116. Due to the arrangement of the switches 402, 404, 406, and 408, the switching circuit can continue fail safe operation even if one of the switches 402, 404, 406, or 408 fails to open when commanded to open or fails to close when commanded to close. Such fail safe operation prevents damage to the system 100 when one of the switches 402, 404, 406, or 408 fails. These failure modes are described with respect to FIGS. 5A-H.

Figure 5A:
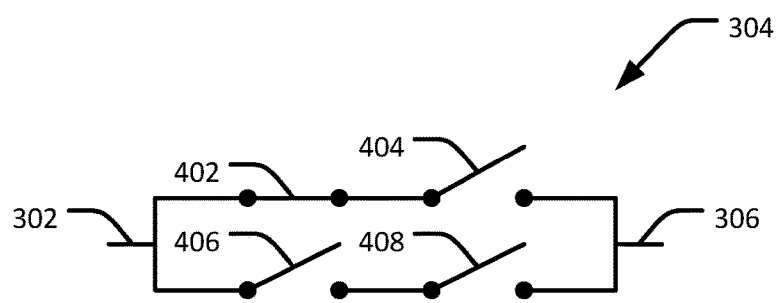
FIG. 5A is a schematic diagram of an example switching circuit in the open state where a first switch has failed to open when commanded to open, in accordance with an embodiment of the present disclosure.

FIG. 5A is a schematic diagram of the switching circuit 304 of FIG. 3 in the open state where the first switch 402 has failed to open when commanded to open. In this condition, the second switch 404, the third switch 406, and the fourth switch 408 are open when commanded to open, thereby interrupting the flow of current between the input terminal 304 and the output terminal 306.

Figure 5B:
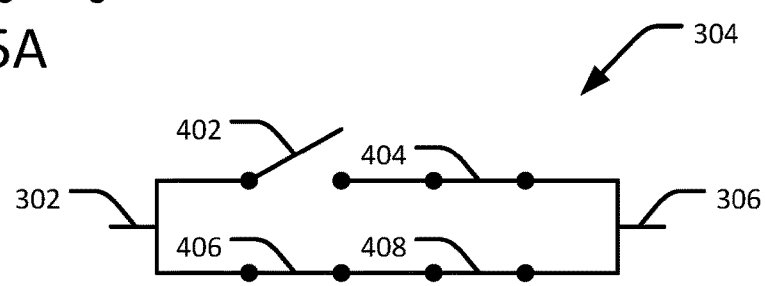
FIG. 5B is a schematic diagram of an example switching circuit in the closed state where the first switch has failed to close when commanded to close, in accordance with an embodiment of the present disclosure.

FIG. 5B is a schematic diagram of the switching circuit 304 of FIG. 3 in the closed state where the first switch 402 has failed to close when commanded to close. In this condition, the second switch 404, the third switch 406, and the fourth switch 408 are closed when commanded to close, thereby connecting the input terminal 304 to the output terminal 306 via a path through the switches 406 and 408.

Figure 5C:
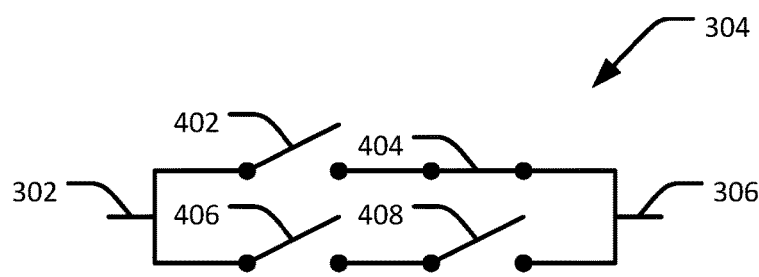
FIG. 5C is a schematic diagram of an example switching circuit in the open state where a second switch has failed to open when commanded to open, in accordance with an embodiment of the present disclosure.

FIG. 5C is a schematic diagram of the switching circuit 304 of FIG. 3 in the open state where the second switch 404 has failed to open when commanded to open. In this condition, the first switch 402, the third switch 406, and the fourth switch 408 are open when commanded to open, thereby interrupting the flow of current between the input terminal 304 and the output terminal 306.

Figure 5D:
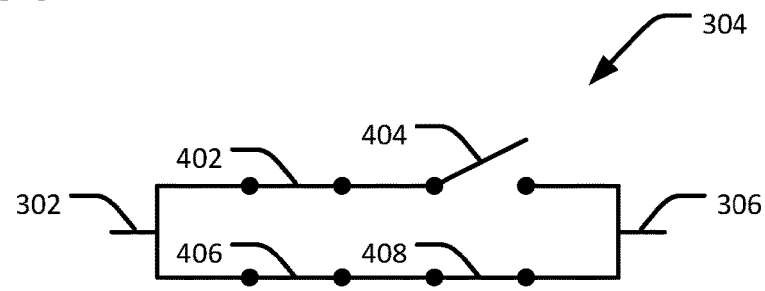
FIG. 5D is a schematic diagram of an example switching circuit in the closed state where the second switch has failed to close when commanded to close, in accordance with an embodiment of the present disclosure.

FIG. 5D is a schematic diagram of the switching circuit 304 of FIG. 3 in the closed state where the second switch 404 has failed to close when commanded to close. In this condition, the first switch 402, the third switch 406, and the fourth switch 408 are closed when commanded to close, thereby connecting the input terminal 304 to the output terminal 306 via a path through the switches 406 and 408.

FIG. 5E is a schematic diagram of the switching circuit 304 of FIG. 3 in the open state where the third switch 406 has failed to open when commanded to open. In this condition, the first switch 402, the second switch 404, and the fourth switch 408 are open when commanded to open, thereby interrupting the flow of current between the input terminal 304 and the output terminal 306.

FIG. 5F is a schematic diagram of the switching circuit 304 of FIG. 3 in the closed state where the third switch 406 has failed to close when commanded to close. In this condition, the first switch 402, the second switch 404, and the fourth switch 408 are closed when commanded to close, thereby connecting the input terminal 304 to the output terminal 306 via a path through the switches 402 and 404.

FIG. 5G is a schematic diagram of the switching circuit 304 of FIG. 3 in the open state where the fourth switch 408 has failed to open when commanded to open. In this condition, the first switch 402, the second switch 404, and the third switch 406 are open when commanded to open, thereby interrupting the flow of current between the input terminal 304 and the output terminal 306.

FIG. 5H is a schematic diagram of the switching circuit 304 of FIG. 3 in the closed state where the fourth switch 408 has failed to close when commanded to close. In this condition, the first switch 402, the second switch 404, and the third switch 406 are closed when commanded to close, thereby connecting the input terminal 304 to the output terminal 306 via a path through the switches 402 and 404.

In some embodiments, a three-out-of-four voting scheme is used to determine whether any of the switches 402, 404, 406, or 408 has failed. For example, if the switching circuit 304 is commanded to the open state and any one of the switches 402, 404, 406, or 408 fails to open, then the status signal 320 to the watchdog 114 can be set to a logical low (off). Likewise, if the switching circuit 304 is commanded to the closed state and any one of the switches 402, 404, 406, or 408 fails to close, then status signal 320 to the watchdog 114 can be set to a logical low (off). However, it is important to note that the voltage isolation device 116 can continue to operate normally with any one failed switch 402, 404, 406, or 408 (either failed open or failed closed). If more than one of the switches 402, 404, 406, or 408 fails, the system 100 can be shut down to prevent damage to the payload(s) 110 and/or the device(s) 128 on the power bus.

Figure 6:
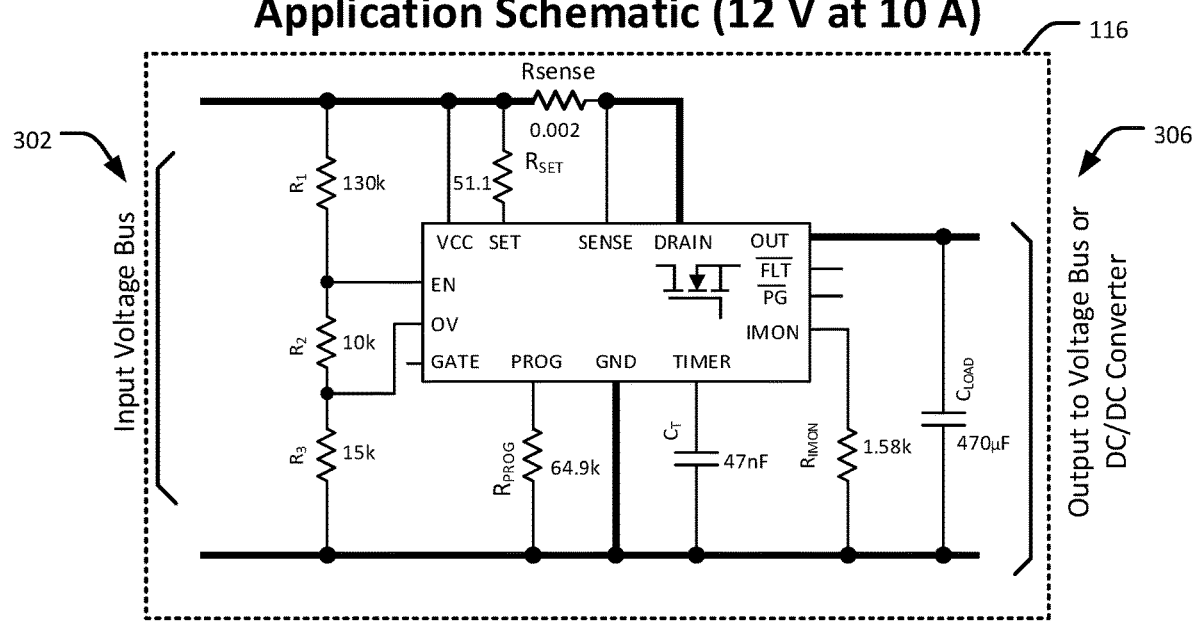
FIG. 6 is a schematic diagram of an example voltage isolation device, in accordance with an embodiment of the present disclosure.

FIG. 6 is a schematic diagram of the voltage isolation device 116, in accordance with an embodiment of the present disclosure. As discussed with respect to FIGS. 4A-B, the switch function implemented within the voltage isolation device 116 employs four inexpensive off-the-shelf small power switches with an integrated MOSFET between the input terminal 302 and the output terminal 306, providing independent and autonomous overcurrent and overvoltage switched power to the electrical loads, and providing telemetry to the MCU 108.

Additional Examples

Numerous embodiments will be apparent in light of the present disclosure, and features described herein can be combined in any number of configurations.

Example 1 provides a power distribution device, including an input configured to receive power from a power source; an output configured to provide the power to an electrical load; a power switch controller configured to selectively operate the power distribution device in a first mode responsive to a first event, and to selectively operate the power distribution device in a second mode responsive to a second event; and a voltage isolation device including a plurality of switches configured, in the first mode, to pass the power between the input and the output, and, in the second mode, to interrupt the passage of the power between the input and the output, the plurality of switches including first, second, third, and fourth switches between the input and the output, the first and second switches in series with each other, the third and fourth switches in series with each other, and the first and second switches in parallel with the third and fourth switches.

Example 2 includes the subject matter of Example 1, where the plurality of switches are configured such that the power is passed between the input and the output when one of the switches is open, and such that the passage of the power is interrupted between the input and the output when one of the switches is closed.

Example 3 includes the subject matter of Example 2, where the power switch controller is configured to command each of the switches closed in the first mode, and to command each of the switches open in the second mode.

Example 4 includes the subject matter of any of Examples 1-3, where the power switch controller is configured to detect at least one of an overvoltage condition and/or an overcurrent condition, and to selectively operate the power distribution device in the second mode in response to detecting the overvoltage condition and/or the overcurrent condition.

Example 5 includes the subject matter of any of Examples 1-4, where the second event includes at least one of: an absence of an enable signal at the power switch controller, a presence of an overcurrent condition at the electrical load, a presence of an undercurrent condition at the electrical load, a presence of an overvoltage condition at the electrical load, a presence of an undervoltage condition at the electrical load, a presence of an overtemperature condition at the electrical load, a presence of a high radiation condition at the electrical load, a presence of an out-of-range operating condition at the electrical load, at least one of the switches failed to close in the first mode, and/or at least one of the switches failed to open in the second mode.

Example 6 includes the subject matter of any of Examples 1-5, where the first event includes at least one of: a presence of an enable signal at the power switch controller, an absence of an overcurrent condition at the electrical load, an absence of an undercurrent condition at the electrical load, an absence of an overvoltage condition at the electrical load, an absence of an undervoltage condition at the electrical load, an absence of an overtemperature condition at the electrical load, an absence of a high radiation condition at the electrical load, and/or an absence of an out-of-range operating condition at the electrical load.

Example 7 includes the subject matter of any of Examples 1-6, where the power switch controller includes a microcontroller operatively coupled to the power source, the power switch circuit, and/or the load, and where the microcontroller is configured to detect the first event and/or the second event independently of the voltage isolation device. In some examples, the microcontroller is radiation-tolerant or radiation-hardened.

Example 8 provides a power distribution device, including an input configured to receive power from a power source; an output configured to provide the power to an electrical load; at least four switches between the input and the output; and a power switch controller configured, in a first mode, to pass the power between the input and the output by closing at least three of the at least four switches and, in a second mode, to interrupt the passage of the power between the input and the output by opening at least three of the at least four switches. The power source is selectively isolatable from a platform power supply by at least one of the at least four switches.

Example 9 includes the subject matter of Example 8, where the at least four switches comprises first, second, third, and fourth switches between the input and the output, the first and second switches in series with each other, the third and fourth switches in series with each other, and the first and second switches in parallel with the third and fourth switches.

Example 10 includes the subject matter of Example 9, where the power switch controller is configured to operate in the second mode if at least one of the four switches fails to open when commanded to open or fails to close when commanded to close.

Example 11 includes the subject matter of any of Examples 8-10, where the power switch controller is configured to detect at least one of an overvoltage condition and/or an overcurrent condition, and to selectively operate the power distribution device in the second mode in response to detecting the overvoltage condition and/or the overcurrent condition.

Example 12 includes the subject matter of any of Examples 8-11, where the power switch controller includes a radiation-tolerant microcontroller operatively coupled to the power source, the power switch circuit, and/or the electrical load, and where the microcontroller is configured to cause the power switch controller to operate in one of the first mode and the second mode.

Example 13 includes the subject matter of any of Examples 8-12, further comprising a watchdog processor configured to selectively enable and disable closing of the at least four switches based on a status signal generated by the microcontroller.

Example 14 is a low Earth orbit (LEO) system comprising the power distribution device of any of Examples 1 through 7, or any of Examples 8 through 13 and the platform power supply.

Example 15 provides a power distribution device, including an input configured to receive power from a power source; an output configured to provide the power to an electrical load; and a voltage isolation device including: a voltage sensor configured to monitor a voltage at the input; a current sensor configured to monitor a current at the input; a temperature sensor configured to monitor a temperature at the electrical load; and a plurality of switches configured, in a first mode, to pass the power between the input and the output based on the voltage, the current, and/or the temperature, and, in a second mode, to interrupt the passage of the power between the input and the output, the plurality of switches including first, second, third, and fourth switches between the input and the output based on the voltage, the current, and/or the temperature, the first and second switches in series with each other, the third and fourth switches in series with each other, and the first and second switches in parallel with the third and fourth switches.

Example 16 includes the subject matter of Example 15, where the plurality of switches are configured such that the power is passed between the input and the output when one of the switches is open, and such that the passage of the power is interrupted between the input and the output when one of the switches is closed.

Example 17 includes the subject matter of any of Examples 15-16, further including a radiation-tolerant microcontroller configured to cause the voltage isolation device to operate in one of the first mode and the second mode.

Example 18 includes the subject matter of any of Examples 15-17, further including a watchdog processor configured to selectively enable and disable closing of the switches based on a status signal generated by the microcontroller, and the microcontroller is configured to generate the status signal based at least in part on a detected event.

Example 19 includes the subject matter of any of Examples 15-19, where the voltage isolation device is configured to command each of the switches closed in the first mode, and to command each of the switches open in the second mode.

Example 20 is a satellite system comprising the power distribution device of any of Examples 1 through 19.

The foregoing description and drawings of various embodiments are presented by way of example only. These examples are not intended to be exhaustive or to limit the present disclosure to the precise forms disclosed. Alterations, modifications, and variations will be apparent in light of this disclosure and are intended to be within the scope of the present disclosure as set forth in the claims.

What is claimed is:

1. A power distribution device, comprising:
   an input configured to receive power from a power source;
   an output configured to provide the power to an electrical load;
   a power switch controller configured to selectively operate the power distribution device in a first mode responsive to a first event, and to selectively operate the power distribution device in a second mode responsive to a second event; and
   a voltage isolation device including a plurality of switches configured, in the first mode, to pass the power between the input and the output, and, in the second mode, to interrupt the passage of the power between the input and the output, the plurality of switches including first, second, third, and fourth switches between the input and the output, the first and second switches in series with each other, the third and fourth switches in series with each other, and the first and second switches in parallel with the third and fourth switches.

2. The power distribution device of claim 1, wherein the plurality of switches are configured such that the power is passed between the input and the output when one of the switches is open, and such that the passage of the power is interrupted between the input and the output when one of the switches is closed.

3. The power distribution device of claim 2, wherein the power switch controller is configured to command each of the switches closed in the first mode, and to command each of the switches open in the second mode.

4. The power distribution device of claim 1, wherein the power switch controller is configured to detect at least one of an overvoltage condition and/or an overcurrent condition, and to selectively operate the power distribution device in the second mode in response to detecting the overvoltage condition and/or the overcurrent condition.

5. The power distribution device of claim 1, wherein the second event includes at least one of:
   an absence of an enable signal at the power switch controller,
   a presence of an overcurrent condition at the electrical load,
   a presence of an undercurrent condition at the electrical load,
   a presence of an overvoltage condition at the electrical load,
   a presence of an undervoltage condition at the electrical load,
   a presence of an overtemperature condition at the electrical load,
   a presence of a high radiation condition at the electrical load,
   a presence of an out-of-range operating condition at the electrical load,
   at least one of the switches failed to close in the first mode, and/or at least one of the switches failed to open in the second mode.

6. The power distribution device of claim 1, wherein the first event includes at least one of:
a presence of an enable signal at the power switch controller,
an absence of an overcurrent condition at the electrical load,
an absence of an undercurrent condition at the electrical load,
an absence of an overvoltage condition at the electrical load,
an absence of an undervoltage condition at the electrical load,
an absence of an overtemperature condition at the electrical load,
an absence of a high radiation condition at the electrical load, and/or
an absence of an out-of-range operating condition at the electrical load.

7. The power distribution device of claim 1, wherein the power switch controller includes a microcontroller operatively coupled to the power source, a power switch circuit, and/or the electrical load, and wherein the microcontroller is configured to detect the first event and/or the second event independently of the voltage isolation device.

8. A power distribution device, comprising:
an input configured to receive power from a power source;
an output configured to provide the power to an electrical load;
at least four switches between the input and the output; and
a power switch controller configured, in a first mode, to pass the power between the input and the output by closing at least three of the at least four switches and, in a second mode, to interrupt the passage of the power between the input and the output by opening at least three of the at least four switches;
wherein the power source is selectively isolatable from a platform power supply by at least one of the at least four switches.

9. The power distribution device of claim 8, wherein the at least four switches comprises first, second, third, and fourth switches between the input and the output, the first and second switches in series with each other, the third and fourth switches in series with each other, and the first and second switches in parallel with the third and fourth switches.

10. The power distribution device of claim 9, wherein the power switch controller is configured to operate in the second mode if at least one of the four switches fails to open when commanded to open or fails to close when commanded to close.

11. The power distribution device of claim 8, wherein the power switch controller is configured to detect at least one of an overvoltage condition and/or an overcurrent condition, and to selectively operate the power distribution device in the second mode in response to detecting the overvoltage condition and/or the overcurrent condition.

12. The power distribution device of claim 8, wherein the power switch controller includes a radiation-tolerant microcontroller operatively coupled to the power source, a power switch circuit, and/or the electrical load, and wherein the microcontroller is configured to cause the power switch controller to operate in one of the first mode and the second mode.

13. The power distribution device of claim 12, further comprising a watchdog processor configured to selectively enable and disable closing of the at least four switches based on a status signal generated by the microcontroller.

14. A low Earth orbit (LEO) system comprising the power distribution device of claim 8 and the platform power supply.

15. A power distribution device, comprising:
an input configured to receive power from a power source;
an output configured to provide the power to an electrical load; and
a voltage isolation device including:
a voltage sensor configured to monitor a voltage at the input;
a current sensor configured to monitor a current at the input;
a temperature sensor configured to monitor a temperature at the electrical load; and
a plurality of switches configured, in a first mode, to pass the power between the input and the output based on the voltage, the current, and/or the temperature, and, in a second mode, to interrupt the passage of the power between the input and the output, the plurality of switches including first, second, third, and fourth switches between the input and the output based on the voltage, the current, and/or the temperature, the first and second switches in series with each other, the third and fourth switches in series with each other, and the first and second switches in parallel with the third and fourth switches.

16. The power distribution device of claim 15, wherein the plurality of switches are configured such that the power is passed between the input and the output when one of the switches is open, and such that the passage of the power is interrupted between the input and the output when one of the switches is closed.

17. The power distribution device of claim 15, further comprising a radiation-tolerant microcontroller configured to cause the voltage isolation device to operate in one of the first mode and the second mode.

18. The power distribution device of claim 17, further comprising a watchdog processor configured to selectively enable and disable closing of the switches based on a status signal generated by the microcontroller, and the microcontroller is configured to generate the status signal based at least in part on a detected event.

19. The power distribution device of claim 15, wherein the voltage isolation device is configured to command each of the switches closed in the first mode, and to command each of the switches open in the second mode.

20. A satellite system comprising the power distribution device of claim 15.

* * * * *